Oct. 29, 1957 E. EBERHARD 2,811,643
TRANSISTOR OSCILLATOR
Filed Jan. 3, 1955
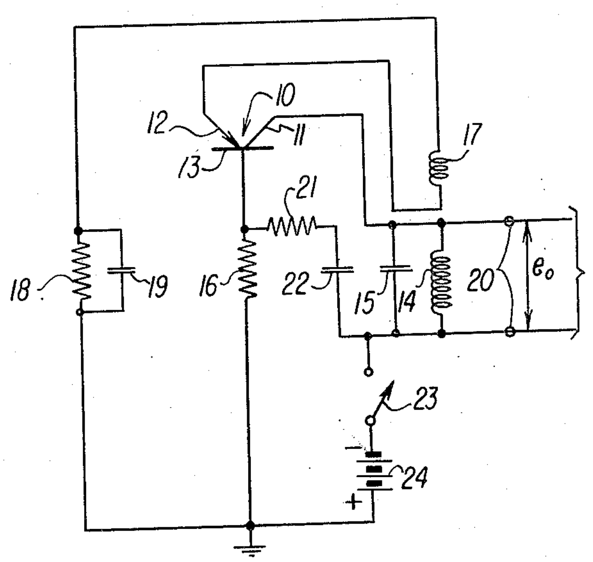
INVENTOR.
Everett Eberhard
BY
Mueller & Aichele
Attys.

United States Patent Office 2,811,643

Patented Oct. 29, 1957

2,811,643

TRANSISTOR OSCILLATOR

Everett Eberhard, Phoenix, Ariz., assignor to Motorola, Inc., Chicago, Ill., a corporation of Illinois Application January 3, 1955, Serial No. 479,392

5 Claims. (Cl. 250—36)

The present invention relates to oscillator circuits, and more particularly to an improved oscillator of the transistor type.

There has long been a need for an efficient miniature oscillator unit that will operate for an appreciable length of time from a self-contained battery. The advent of the transistor has rendered such an oscillator feasible since the transistor requires no heater power and moderate direct current electrode power. However, an important requirement for any oscillator is that it be self-starting at any point in its operating temperature range even under load, and that it use but a single battery. These requirements have created certain problems that must be solved before the construction of such transistor oscillators can be an accomplished fact.

In an electron discharge tube, space current normally flows when there is no bias on the control grid, so that an oscillator incorporating such a tube usually starts oscillating upon the application of an exciting potential and, as oscillations are produced, the tube may be biased back negatively by a cathode resistor to the desired operating point. A transistor, on the other hand connected in usual manner, requires that its emitter electrode be biased in a forward direction before any substantial collector current flows. Some forward bias is provided to the emitter junction by the base potential resulting from collector current that flows through the internal base resistance with zero emitter current. However, unlike a vacuum tube, an essential requirement (especially in point-contact transistors) is that the current at zero emitter current be kept as low as possible. Therefore, with typical present day transistors, the space current flow due to the collector bias when the oscillator switch is first closed cannot be depended upon to provide sufficient bias at the emitter junction so as to set up oscillation in the circuits.

Sufficient bias for starting the oscillator under all normal load and temperature conditions can always be provided by returning the emitter electrode to ground, and by connecting the base electrode to an intermediate point on a resistance potentiometer connected across a biasing source of suitable polarity to bias the emitter junction in the forward direction. It is essential, however, for frequency stability of the oscillator that the resistance between the base electrode and ground be as low as possible. It has been found that when this resistance is made sufficiently low for frequency stability, excessive drain on the battery results. Therefore, for good frequency stability and starting of the oscillator under all conditions, it was necessary in prior art circuits that an excessive amount of power be used.

It is an object of the present invention to provide a simple and improved transistor oscillator that oscillates with a high degree of stability, which may be started under all normal temperature and load conditions, and which makes the most efficient use of the power available.

A feature of the invention is the provision of a resistor means and series-connected capacitor means across a unidirectional bias potential source, with an intermediate point on the resistor means being connected to an electrode of the transistor, so as to provide a transient bias on that electrode when the circuit is first put into operation so that oscillation is initiated, after which the capacitor reaches full charge and cuts off the bias potential across the resistor means when it is no longer needed, thus reducing the drain on the bias source.

The above and other features of the invention which are believed to be new are set forth with particularity in the appended claims. The invention itself, however, together with further objects and advantages thereof, may best be understood by reference to the following description when taken in conjunction with the accompanying drawing in which the single figure shows a transistor oscillator constructed in accordance with the invention.

The invention provides an oscillator circuit comprising a transistor having a base electrode, an emitter electrode and a collector electrode. First resistor means connects the base electrode to a point of reference potential, and a parallel resonant tuned circuit has one side connected to the collector electrode. The emitter electrode is connected to the point of reference potential through a feedback coil that is inductively coupled to the resonant network and through a resistance-capacity biasing network that is connected in series with the feedback coil. A second resistor means and a capacitor means are series-connected with the first resistor means, and means is provided for impressing a unidirectional bias potential between the other side of the tuned circuit and the point of reference potential and across the capacitor means and first and second resistor means so as to provide a transient bias potential of a selected polarity to the base electrode. In this manner, the emitter electrode is biased in a forward direction when the circuit is first energized so as to build up oscillation in the circuit. When the capacitor means referred to above charges up, the bias on the base electrode due to the first and second resistor means decreases as does the load on the battery. When this occurs, however, sufficient current flow is built up across the emitter junction so that the resistance-capacity network in the emitter circuit provides the desired bias to the emitter so that oscillation is sustained.

The oscillator circuit of the invention includes a transistor 10 having a collector electrode 11, an emitter electrod 12 and a base electrode 13. A parallel-tuned resonant network including an inductance coil 14 and a shunt-connected capacitor 15 has one side connected to the collector electrode 11. A resistor 16 is connected between the base electrode and a point of reference potential or ground, and this resistor has a sufficiently low value for stable oscillation of the circuit. The emitter electrode 12 is connected to the point of reference potential through a feedback coil 17 and through a resistance-capacity network including resistor 18 and shunting capacitor 19, the coil 17 being inductively coupled to inductance coil 14 of the tuned network 14, 15. The output terminals 20 of the circuit are connected across network 14, 15 and the output signal $e_o$ appears across the terminals.

A resistor 21 and capacitor 22 are series-connected with the ungrounded side of resistor 16 and to the side of network 14, 15 remote from the collector electrode 11. A switch 23 is provided which connects the common junction of capacitor 22 and network 14, 15 to the negative terminal of a biasing source 24 whose positive terminal is connected to the point of reference potential.

When switch 23 is closed, direct current flows from source 24 into capacitor 22 and through resistors 21, 16. This current provides a negative direct current bias on base 13 due to the resulting potential drop across resistor 16 so that the emitter junction is biased in a forward direction. The elements 16, 21 and 22 are chosen so that sufficient current is drawn from source 24 to provide enough bias to the emitter so that the oscillator will oscillate under all normal temperature and load conditions. When capacitor 22 reaches full charge, the current through resistors 16, 21 from the source 24 falls to zero. How ever, by this time, oscillation is established in the circuit, and the emitter junction receives its bias from the self-biasing action of network 18, 19.

Therefore, current is drawn from source 24 for the purpose described above, only so long as it is needed so that the overall drain is materially reduced.

The circuit will function properly under some conditions without the use of resistor 21. If the battery potential is relatively low, and the required starting transient can be relatively short, capacitor 22 can be connected directly to the junction of the transistor base electrode and resistor 16. In this case, capacitor 22 will also act as an alternating current by-pass across resistor 16 when the circuit is in oscillation. This does not appreciably alter the operation of the oscillator.

In a constructed embodiment of the invention the following parameters were used, and these are listed herein merely by way of example and are not intended to limit the invention in any way:

| | | |
|---|---|---|
| Source **24** | volts | 11.5 |
| Resistor **21** | ohms | 1,000 |
| Resistor **16** | do | 100 |
| Capacitor **22** | microfarads | 1 |

The invention provides, therefore, an exceedingly simple and compact oscillator unit that will start under all normal temperature and load conditions and which draws relatively low current from the potential source thereof.

I claim:

1. An oscillator circuit including in combination, a transistor having a base electrode, an emitter electrode and a collector electrode; first resistor means connecting said base electrode to a point of reference potential; a parallel-resonant tuned circuit having first and second terminals, with said first terminal being connected to said collector electrode; a circuit connecting said emitter electrode to said point of reference potential, said circuit including a feedback network inductively coupled to said tuned circuit and further including shunt-connected resistance and capacitance means connected in series with said feedback network; second resistor means and capacitor means connected in series between said base electrode and said second terminal of said tuned circuit and means for impressing a unidirectional bias potential between said second terminal of said tuned circuit and said point of reference potential to provide bias for the transistor, with such bias having a transient component on said base electrode.

2. An oscillator circuit including in combination, a transistor having a first electrode, a second electrode and a third electrode; first resistor means connecting said first electrode to a point of reference potential; a parallel-resonant tuned circuit having first and second terminals, with said first terminal being connected to said second electrode; a circuit connecting said third electrode to said point of reference potential, said circuit including a feedback network inductively coupled to said tuned circuit and further including shunt-connected resistance and capacitance means connected in series with said feedback network; second resistor means and capacitor means series-connected in series between said first electrode and said second terminal of said tuned circuit; and means for impressing a unidirectional bias potential between said second terminal and said point of reference potential to provide bias for the transistor, with such bias having a transient component on said first electrode.

3. In an oscillator circuit which includes a transistor having at least three electrodes, a network for providing a transient bias for one of the electrodes including in combination, resistor means having a first side connected to one of said electrodes and having a second side connected to a point of reference potential, capacitor means, means connecting one side of said capacitor means to said first side of said resistor means, and means for impressing a direct current potential between the other side of said capacitor means and said point of reference potential so that the charging current of said capacitor means flowing in said resistor means provides a momentary bias for said one of said electrodes.

4. In an oscillator circuit which includes a transistor having at least three electrodes, a tuned network having one side connected to a first of said electrodes, a feedback circuit coupled to said tuned network and connected to a second of said electrodes, and resistor means connecting a third of said electrodes to a point of reference potential; a network for providing a bias for said transistor including in combination, capacitor means, means connecting one side of said capacitor means to said third electrode, means connecting the other side of said capacitor means to the other side of said tuned network, and means for impressing a direct current bias potential between said other side of said capacitor means and said point of reference potential.

5. In an oscillator circuit which includes a transistor having a base, an emitter, and a collector; a tuned network including an inductance coil and a shunting capacitor, said tuned network having one side connected to said collector; a feedback circuit including an inductance coil inductively coupled to said tuned network and having one side connected to said emitter, and said feedback circuit further including a resistor and a shunting capacitor connecting the other side of said last-named inductance coil to a point of reference potential; and a resistor connecting said base to said point of reference potential; a network for providing a bias for said transistor including in combination, a resistor and a capacitor series connected in that order between said base and the other side of said tuned network, and means for impressing a direct current bias potential between said other side of said tuned network and said point of reference potential.

References Cited in the file of this patent

UNITED STATES PATENTS 2,728,049 Riddle ---------------- Dec. 20, 1955

OTHER REFERENCES

Article: "Transistor Circuitry," by Clay, pages 35 to 38 of QST for December 1953.